(12) United States Patent
Asano

(10) Patent No.: US 6,396,665 B1
(45) Date of Patent: May 28, 2002

(54) HEAD SUSPENSION ASSEMBLY WITH A RELAY PRINTED CIRCUIT BOARD HAVING OPENINGS THROUGH WHICH ELECTRODES PROTUDE

(75) Inventor: Takahiro Asano, Tokyo (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/483,497

(22) Filed: Jan. 14, 2000

Related U.S. Application Data (63) Continuation of application No. 09/018,970, filed on Feb. 5, 1998, now abandoned.

(30) Foreign Application Priority Data

Dec. 25, 1997 (JP) .............................................. 9-358541

(51) Int. Cl.$^7$ ............................................... G11B 5/48
(52) U.S. Cl. .................................................. 360/264.2
(58) Field of Search ........................... 360/264.2, 245.9, 360/245.8, 266.3, 234.5, 281.7, 246

(56) References Cited

FOREIGN PATENT DOCUMENTS

JP          9-64487          3/1997

*Primary Examiner*—A. J. Heinz
*Assistant Examiner*—Angel Castro
(74) *Attorney, Agent, or Firm*—Gray Cary Ware & Freidenrich LLP (57) ABSTRACT

A plurality of connecting pads are provided at an extended end portion of a main FPC, and a solder bump is formed on each connecting pad. A plurality of openings corresponding to the solder bumps are formed on a connecting end portion of a relay FPC. Second electrode pads of the connecting end portion project into the respective openings so as to close a part of each opening. Each of the second electrode pads contacts with the corresponding bump through the opening. By directly heating the second electrode pad through the opening, so that the solder bump is melted and each electrode pad is soldered to the corresponding connecting pad.

15 Claims, 8 Drawing Sheets

HEAD SUSPENSION ASSEMBLY WITH A RELAY PRINTED CIRCUIT BOARD HAVING OPENINGS THROUGH WHICH ELECTRODES PROTUDE

This application is a continuation of Ser. No. 09/018,970, filed Feb. 5, 1998, now abandoned.

BACKGROUND OF THE INVENTION

The present invention relates to a magnetic disk drive, in particular, to a magnetic disk drive where a magnetic head supported by a carriage assembly is connected with a control section through a flexible printed circuit board, a head suspension assembly used in the magnetic disk drive, and a method of connecting a relay printed circuit board and a main printed circuit board.

In general, a magnetic disk drive comprises a magnetic disk arranged in a case, a spindle motor for supporting and rotating the magnetic disk, a carriage assembly for supporting a magnetic head, a voice coil motor for driving the carriage assembly, and a substrate unit.

The carriage assembly comprises a bearing portion mounted on the case, and a plurality of arms extending from the bearing portion, with a magnetic head attached to each of the arms via a suspension. The substrate unit has a main flexible printed circuit board (hereinafter referred to as a main FPC) extending to the vicinity of the bearing portion. Each of the magnetic heads is connected to one end of a relay flexible printed circuit board (hereinafter referred to as a relay FPC) provided on the arm, and the other end of the relay FPC is connected with the main FPC. Thus, each of the magnetic heads is electrically connected to the substrate unit via the relay FPC and the main FPC, to be controlled by the substrate unit.

In general, a flexible printed circuit board such as the main FPC and the relay FPC includes a base layer formed of an insulating material, a conductor pattern formed on the base layer and having a plurality of pads in a connecting portion, and a cover layer covering the entire conductor pattern excluding the pads.

A plurality of pads constituting a connecting portion are provided at the extended end of the main FPC, with each of the pads being plated with gold or solder. A plurality of pads constituting a connecting portion are provided at the other end of each of the relay FPCs, with a metallic bump being formed on each of the pads. Furthermore, a solder layer is formed on the bump.

When the connecting portion of the main FPC and the other end portion of the relay FPC are electrically connected, the other end portion of the relay FPC and the connecting portion of the main FPC are arranged facing to each other such that the pads of the main FPC and the bumps of the relay FPC oppose to one another. In this state, by heating the bumps and the solder layers on the pads from the base layer side of the relay FPC with a heating member such as a soldering iron, the solder layers are melted so that the pads provided in the connecting portion of the main FPC and the pads provided at the other end portion of the relay FPC can be electrically and mechanically connected with one another.

However, in the above-mentioned magnetic disk drive, since the heat for melting the solder layers is applied to the solder layers through the base layer of the relay FPC in connecting the main and relay FPCs, it is difficult to melt the solder layers quickly and sufficiently. Therefore, an oxide layer may be formed easily on the surface of the solder layer to deteriorate the connection reliability. Further, it is difficult to check the connecting state after soldering by the visual inspection, and thus it is difficult to guarantee the quality of the connecting portion to be a great obstacle in terms of maintaining the reliability.

BRIEF SUMMARY OF THE INVENTION

The present invention has been contrived in consideration of the above-mentioned problems, and its object is to provide a magnetic disk drive capable of connecting a main flexible printed circuit board and a relay flexible printed circuit board easily and securely, allowing the visual inspection of a connecting portion, with a high connection reliability and a high quality, with a good assembling convenience, a head suspension assembly used in the magnetic disk drive, and a method of connecting a relay printed circuit board and a main printed circuit board to each other.

In order to achieve the above-mentioned object, a head suspension assembly used in a magnetic disk drive according to the present invention comprises a plate-like suspension having one end mounted with a magnetic head and the other end fixed to an arm; and a relay printed circuit board fixed on the suspension and the arm and having one end connected to the magnetic head and a connecting end portion extending to the arm.

The relay printed circuit board comprises a base layer, a conductor pattern formed on the base layer, a cover layer covering the conductor pattern, and a plurality of openings formed in the connecting end portion. The conductor pattern includes a plurality of electrode pads protruding into the openings, respectively.

A magnetic disk drive according to the present invention comprises a magnetic disk, a magnetic head for recording and reproducing information for the magnetic disk, a carriage assembly supporting the magnetic head to be movable with respect to the magnetic disk, a substrate unit for inputting/outputting signals for the magnetic head, a main printed circuit board extending from the substrate unit and having an extended end portion attached to the carriage assembly, and a relay printed circuit board provided on the carriage assembly, and having one end portion connected to the magnetic head, and a connecting end portion connected to the main printed circuit board.

The main printed circuit board comprises a base layer, a conductor pattern formed on the base layer, having a plurality of connecting pads provided in the extended end portion, a cover layer covering the conductor pattern excluding the pads, and a bump formed on each of the connecting pads by soldering;

The relay printed circuit board comprises a base layer, a conductor pattern formed on the base layer, a cover layer covering the conductor pattern, and a plurality of openings formed in the connecting portion so as to correspond to the pads of the main printed circuit board, wherein the conductor pattern comprises a plurality of electrode pads protruding to the inside of the openings.

The connecting end portion of the relay printed circuit board is arranged to oppose the extended end portion of the main printed circuit board such that the bumps of the main printed circuit board can contact with the respective electrode pads of the relay printed circuit board through the openings, and the electrode pads of the relay printed circuit board are soldered to the connecting pads of the main printed circuit board by heating and melting each of the bumps through the openings.

According to the magnetic disk drive having the above-mentioned construction, upon connecting the connecting end portion of the relay printed circuit board to the extended end portion of the main printed circuit board, the electrode pads and/or the bumps can be directly heated to melting the solder through the openings of the connecting end portion. At the same time, the connecting state can be observed visually through the openings.

In the above-mentioned magnetic disk drive, each electrode pad closes a part of the corresponding opening so that the heated and melted solder can flow on the side of the outer surface of the relay printed circuit board through the opening.

According to the construction, the heated and melted solder can reach the opposite side of the relay printed circuit board through the openings, thereby covering the entirety of the electrode pads.

Furthermore, according to a magnetic disk drive according to the present invention, each bump of the main printed circuit board has a height larger than the thickness of the connecting end portion of the relay printed circuit board before heating and melting the bump so that the bump protrudes from the outer surface of the relay printed circuit board on the opposite side with respect to the main printed circuit board as well as it pushes up the electrode pads in the direction projecting from the outer surface of the relay printed circuit board.

According to the magnetic disk drive of the above-mentioned construction, since the electrode pads project from the relay printed circuit board through the openings, a heat source can easily contact with the electrode pads, so that the connecting operation can be improved.

According to a magnetic disk drive according to the present invention, each bump of the main printed circuit board has a first bump made a conductive material having a melting point higher than that of the solder and formed on the connecting pad, and a second bump made of a solder and covering the first bump.

With the magnetic disk drive of the above-mentioned construction, since the first bump is provided, the height of the bump can be easily controlled even at the time of heating and melting of the solder so that the connecting position of the electrode pads can be controlled to be at a desired position.

A method of the present invention for connecting a connecting end portion of a relay printed circuit board and a extended end portion of a main printed circuit board, comprising the steps of:

preparing a main printed circuit board including a base layer, a conductor pattern formed on the base layer and having a plurality of connecting pads provided at the extended end portion, a cover layer covering the conductor pattern excluding the connecting pads, and a bump of solder formed on each of the connecting pads;

preparing a relay printed circuit board including a base layer, a conductor pattern formed on the base layer, a cover layer covering the conductor pattern, and a plurality of openings formed in the connecting end portion in correspondence with the connecting pads of the main printed circuit board, the conductor pattern having a plurality of electrode pads protruding into the openings, respectively;

opposing the connecting end portion of the relay printed circuit board to the extended end portion of the main printed circuit board such that the bumps of the main printed circuit board are in contact with the electrode pads of the relay printed circuit board through the openings, respectively; and soldering the electrode pads of the relay printed circuit board to the connecting pads of the main printed circuit board by heating and melting the bumps through the openings, respectively.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 11C show an HDD according to a first embodiment of the present invention, in which:

FIGS. 14 to 17B show a main FPC and a relay FPC according to a second embodiment of the present invention, in which:

DETAILED DESCRIPTION OF THE INVENTION

Hereinafter embodiments of the present invention adopted in a hard disk drive (hereinafter referred to as HDD) as a magnetic disk drive will be described in detail with reference to the accompanied drawings.

Figure 1:
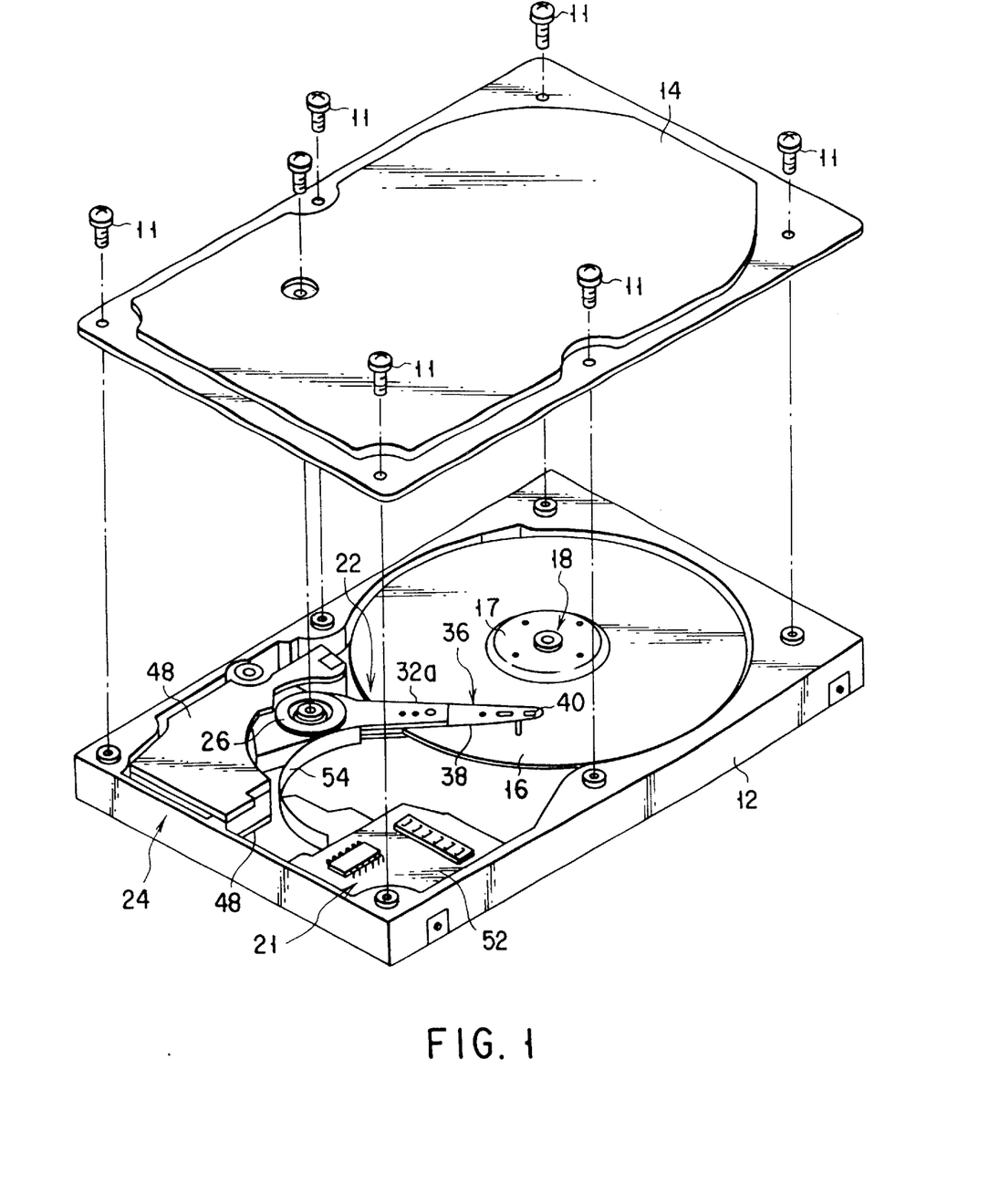
FIG. 1 is an exploded perspective view of the HDD.

As shown in FIG. 1, an HDD comprises a rectangular box-like case 12 with an opened top, and a top cover 14 fastened to the case with a plurality of screws 11 and closing the opened top of the case.

In the case 10 are arranged a magnetic disk 16 as a magnetic recording medium, a spindle motor 18 for supporting and rotating the magnetic disk, a plurality of magnetic heads for recording and reproducing information in the magnetic disk, a carriage assembly 22 supporting the magnetic heads to be movable with respect to the magnetic disk 16, a voice coil motor (hereinafter referred to as VCM) 24 for rotating and positioning the carriage assembly, and a substrate unit 21 having a preamplifier, and the like.

On the outer surface of the bottom wall of the case 12 is mounted a printed circuit board (not shown) for controlling the operation of the spindle motor 18, the VCM 21, and the magnetic heads through the substrate unit 21.

The magnetic disk 16 has a 65 mm (2.5 inches) diameter with magnetic recording layer on the upper and lower surfaces. The magnetic disk 16 is coaxially fitted on a hub (not illustrated) of the spindle motor 18 and clamped by a clamp spring 17 so as to be, rotated at a certain rate by the spindle motor.

Figure 2:
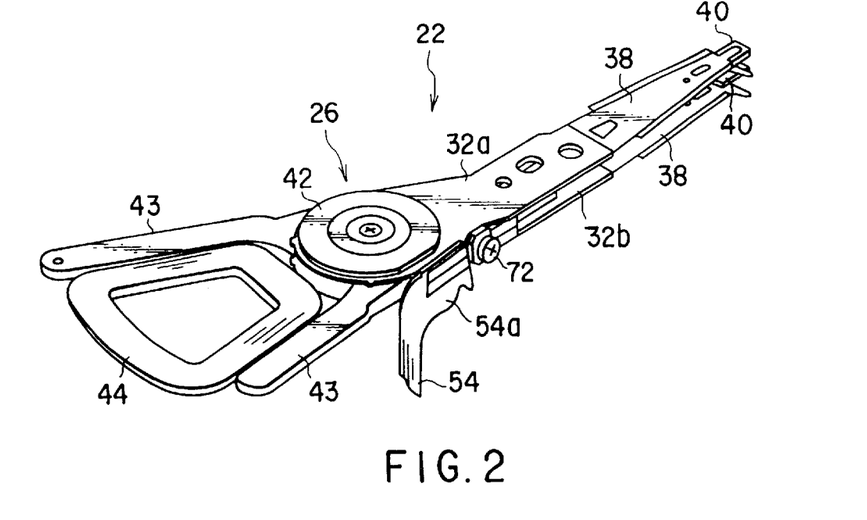
FIG. 2 is a perspective view of a carriage assembly provided in the HDD.
Figure 3:
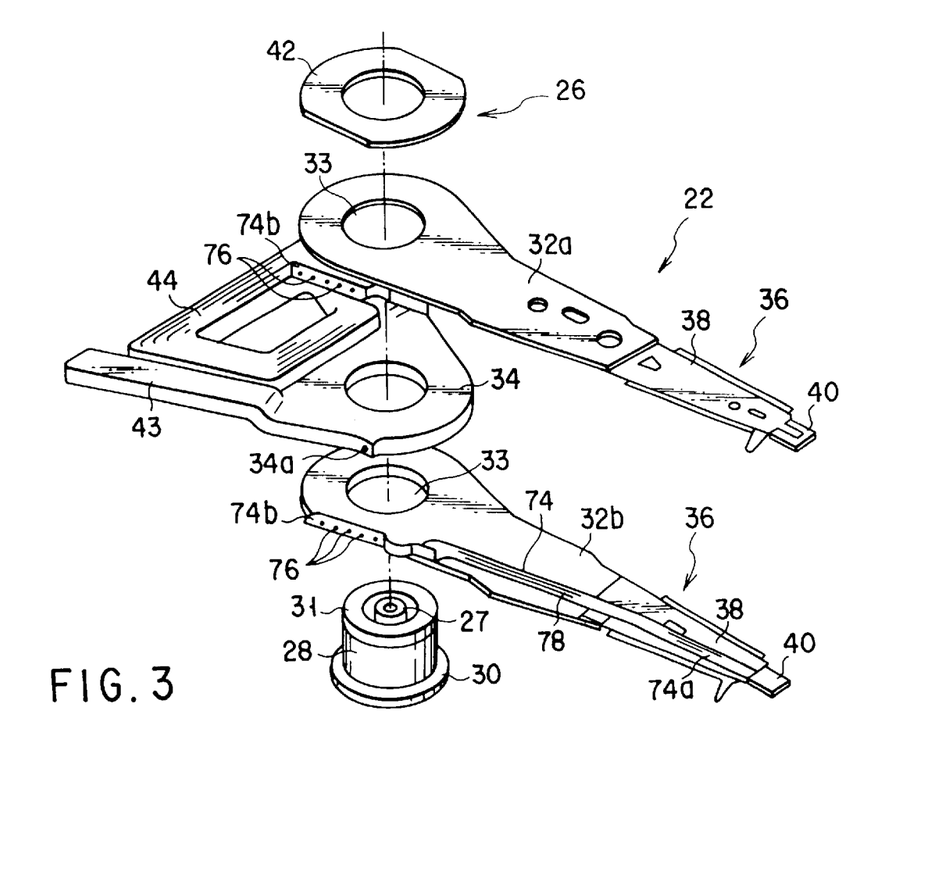
FIG. 3 is an exploded perspective view of the carriage assembly.

As shown in FIGS. 1 to 3, the carriage assembly 22 comprises a bearing assembly 26 fixed on the bottom wall of the case 10. The bearing assembly 26 includes a pivot 27 erected vertically on the bottom wall of the case 10, and a cylindrical hub 28 supported rotatably by the pivot via a pair of bearings. The hub 28 is provided with an annular flange 30 at its lower end and a threaded portion 31 on the outer periphery at the upper end portion.

Further, the carriage assembly 22 comprises two arms 32a, 32b and a spacer ring 34 attached on the hub 28, and two magnetic head assemblies 36 supported by the arms, respectively. The arms 32a and 32b can be formed from a stainless steel material such as SUS 304 in a thin flat plate-like shape with about 250 μm thickness, with a round through hole 33 formed at one end, that is, the proximal end.

Each magnetic head assembly 36 includes an elongate suspension 38, and a magnetic head 40 mounted on the distal end of the suspension. The suspension 38 is formed of a plate spring with a thickness of 60 to 70 μm, and extends from the arm 32a or 32b while its proximal end is fixed to the distal end of the arm 32a or 32b by a spot welding or a bonding. The arms, the magnetic head assemblies 36 fixed to the arms, and a relay FPC described later constitute a head suspension assembly of the present invention.

Each magnetic head 40, fixed to the distal end of the suspension 38, comprises a substantially rectangular slider (not illustrated) and an MR (magnetic resistance) head formed in the slider for recording and reproduction information. Each magnetic head 40 has four electrodes (not illustrated). The suspension 38 may be formed integrally with the arm by the material same as that of the arm.

The arms 32a and 32b to which the magnetic head assemblies 36 are attached are fitted to the outer periphery of the hub by inserting the hub 28 into the through holes 33 and stacked on the flange 30. The spacer ring 34 is fitted to the outer periphery of the hub 28 and interposed between the arms 32a and 32b.

The two arms 32a, 32b and spacer ring 24 fitted to the outer periphery of the hub 28 are clamped between a nut 42 screwed to the threaded portion 31 of the hub 28 and the flange 30 so as to be held on the outer periphery of the hub. Accordingly, the two arms 32a, 32b are positioned parallel to each other with a certain interval as well as extend from the hub 28 in the same direction.

The magnetic heads 40 of the magnetic head assemblies 36 attached on the arms 32a, 32b are positioned facing to each other and rotatable integrally with the arms and hub 28. The spacer ring 34 has two supporting frames 43 extending in the direction opposite to the extending direction of the arms 32a, 32b. A voice coil 44 constituting a part of the VCM 16 is fixed to the supporting frames 43. A screw hole 34a is formed in the spacer ring 34 for screwing the extended end portion of a main FPC described later.

As can be seen well in FIG. 1, in a state where the carriage assembly 22 of the above-mentioned construction assembled in the case 10, the magnetic disk 16 is positioned between the arms 32a, 26b. The magnetic heads 40 attached to the arms 32a, 32b contact with the upper and lower surfaces of the magnetic disk 16, respectively so as to hold the magnetic disk 1 from both sides. Each magnetic head 40 is applied with a certain head load by a spring force of the suspension 38 and urged to the magnetic disk surface in a state where the magnetic disk is stopped.

On the other hand, as shown in FIG. 1, in a state where the carriage assembly 22 is assembled in the case 10, the voice coil 44 fixed to the supporting frames 43 of the spacer ring 34 is positioned between a pair of yolks 48 fixed to the case 10, and constitutes the VCM 16, associated with the yolks and a magnet (not illustrated) fixed to one of the yolks. By supplying an electric power to the voice coil 44, the carriage assembly 22 is rotated and the magnetic heads 40 are moved and positioned onto a desired track of the magnetic disk 16.

As shown in FIG. 1, the substrate unit 17 has a rectangular substrate main body 52 provided on the bottom wall of the case 10, on which a plurality of electronic parts and a connector, and the like are mounted. The substrate unit 21 has a band-shaped main flexible printed circuit board (hereinafter referred to as main FPC) 54 extending from the substrate main body 52 and connected to the carriage assembly 22.

As shown in FIGS. 2 and 4 to 7, the main FPC 54 functioning as a main printed circuit board, has an extended end portion 54a, which is fixed to the spacer ring 34 of the carriage assembly 22 with a screw 72.

Figure 6:
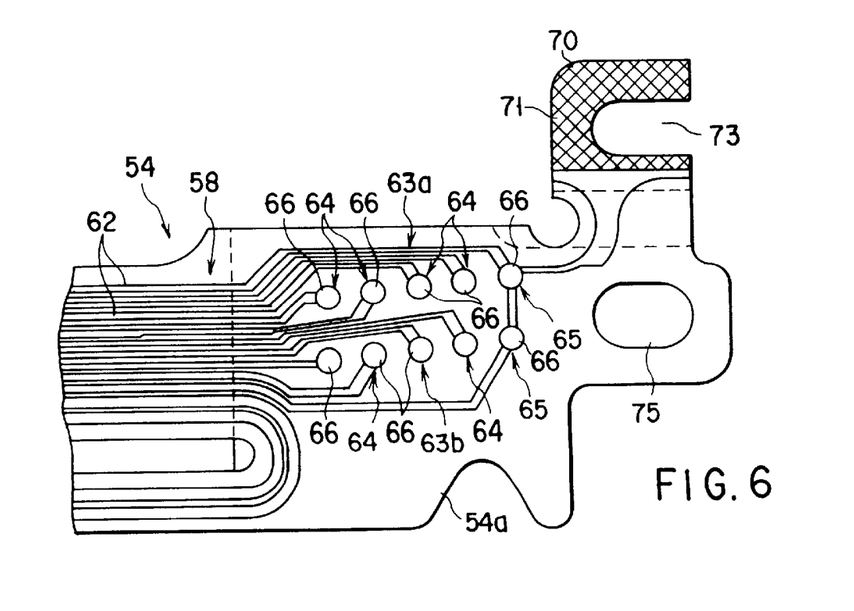
FIG. 6 is an enlarged plan view of the extended end portion of the main FPC.

The main FPC 56 is formed integrally with the substrate main body 52 by a flexible printed circuit board. The main FPC 56 includes a base film (base layer) 56 made from an insulating material such as polyimide, a conductor pattern 58 formed by patterning a copper foil formed on the base film, and a cover layer 60 made from an insulating material and covering the conductor pattern 58 and the base film 56 except for the pad portions of the conductor pattern later described. A reinforcing plate 61 formed of aluminum, and the like, is adhered to the rear surface of the extended end portion 54a of the main FPC 54.

The conductor pattern 58 of the main FPC 54 includes a large number of lead wires 62 extending, in parallel to one another, in the axial direction of the main FPC. Two sets 63a, 63b of connecting pads 64 (pad portions) corresponding to the number of the magnetic heads 40 are formed at the extended end portion 54a of the main FPC 54 and conducted with the substrate main body 52 via the lead lines 62. Each of the sets 63a and 63b includes four connecting pads 64, corresponding to the number of the electrodes of the magnetic head 40, which are disposed in a certain arrangement, for example, they are arranged linearly in the axial direction of the main FPC 56 with a predetermined interval. The two sets 63a and 63b are arranged in parallel to each other with a certain interval.

Each of the set 63a, 63b includes an auxiliary pad 65 for reinforcement, provided adjacent to the connecting pads 64.

Figure 7:
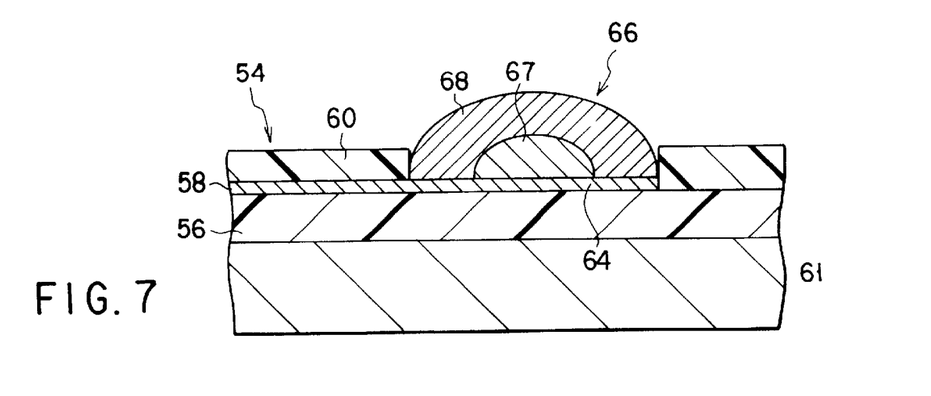
FIG. 7 is a cross-sectional view of a bump provided on the extended end portion of the main FPC.

The connecting pads 64 and the auxiliary pads 63 are formed in a round shape, and a hemisphere bump 66 is formed on the surface of each pad. As shown in FIG. 7, the bump 66 includes a first bump 67 formed on the pad surface by a conductor metal having a melting point higher than that of a solder, such as copper, nickel, and the like, and a second bump 68 formed on the first bump by a solder. The height of each bump 66 is set such that the bump projects higher than the thickness of the relay FPC later described from the surface of the cover layer 60 of the main FPC 54.

The extended end portion 54a of the main FPC 54 has a projecting piece 70 projecting upward from the tip portion thereof, and the conductor pattern 58 has a grand pad 71 formed on the projecting piece 70. At the projecting piece 70, the cover layer 60 is eliminated so that the grand pad 71 is exposed. A through hole 75 and a notch 73 are formed respectively on the tip of the extended end portion 54a and the projecting piece 70 for screwing the extended end portion 54a to the bearing assembly 26 of the carriage assembly 22.

Figure 4:
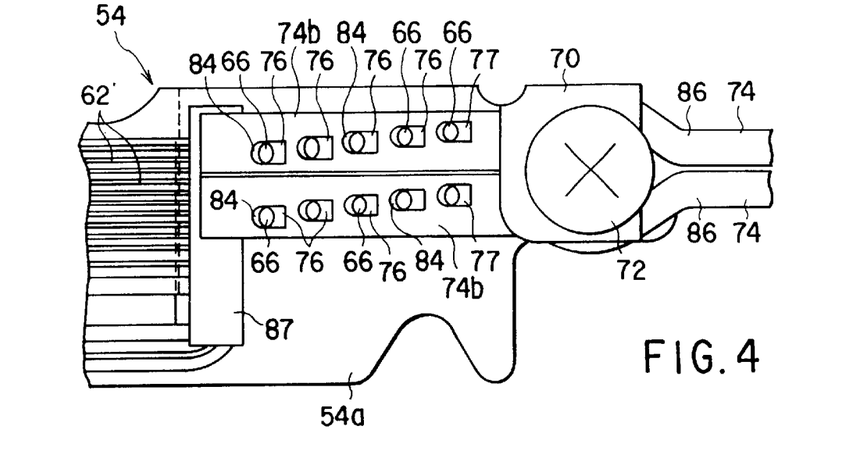
FIG. 4 is a plan view showing the connecting state of an extended end portion of a main FPC extending from a substrate unit arranged in the HDD and a connecting end portion of a relay FPC.

As shown in FIG. 4, the extended end portion 54a of the main FPC 54 is fixed to the bearing assembly 26 of the carriage assembly by bending the projecting piece 70 such that the notch 73 and the through hole 72 are aligned with each other, and screwing the screw 72 to the screw hole 34a (see FIG. 3) of the spacer ring 34 through the notch and the through hole.

On the other hand, the magnetic heads 40 of the carriage assembly 22 are electrically connected to the corresponding connecting pad set 63a, 63b of the main FPC 54 through relay flexible printed circuit board (hereinafter referred to as relay FPC) 74, respectively. As shown in FIG. 3, each of the relay FPCs 74 is adhered to the surfaces of the corresponding arm 32a or 32b and suspension 30 of the carriage assembly 22 and extends from the distal end of the suspension to the proximal end of the arm.

The relay FPC 74 is formed in an elongate band-like shape as a whole and has a distal end portion 74a at the distal end of the suspension 30, and a connecting end portion 74b projecting from the proximal end of the arms 32a, 32b. Four first electrode pads (not illustrated) electrically connected to the electrodes of the magnetic heads 40 are provided on the distal end portion 74a. As shown in FIGS. 3 and 4, four second electrode pads 76 and one auxiliary pad 77 are provided on the connecting end portion 74b. Each second electrode pad 76 (pad portion) is conducted with the corresponding first electrode pad through a lead wire 78.

The relay FPC 74 is bent at the connecting end portion 74b by a right angles so that the connecting end portion extends perpendicular to the arm surface and opposes in parallel to the extended end portion 54a of the main FPC 54 fixed to the bearing assembly 26. The connecting end portion 74b is formed in an elongate rectangular shape extending in the projecting direction of the arm, that is, in the longitudinal direction of the main FPC 54.

Figure 8:
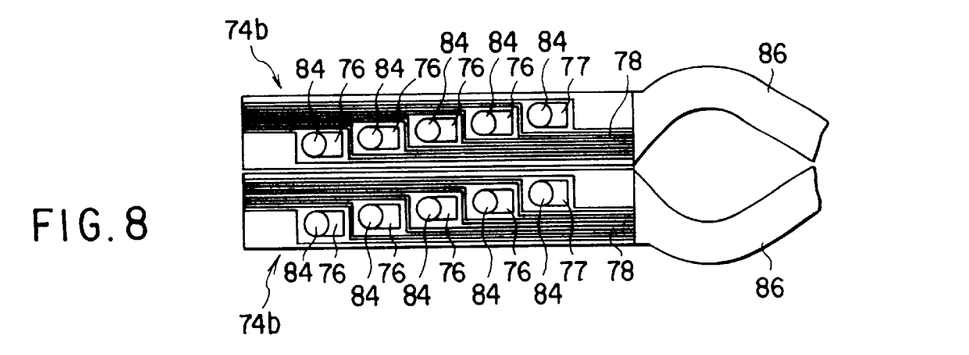
FIG. 8 is a plan view of the connecting end portion of the relay FPC.
Figure 9:
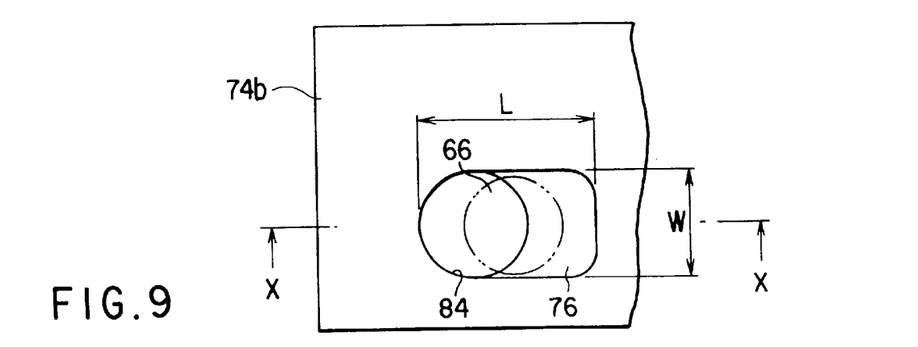
FIG. 9 is an enlarged schematic plan view of a pad portion of the relay FPC.
Figure 10:
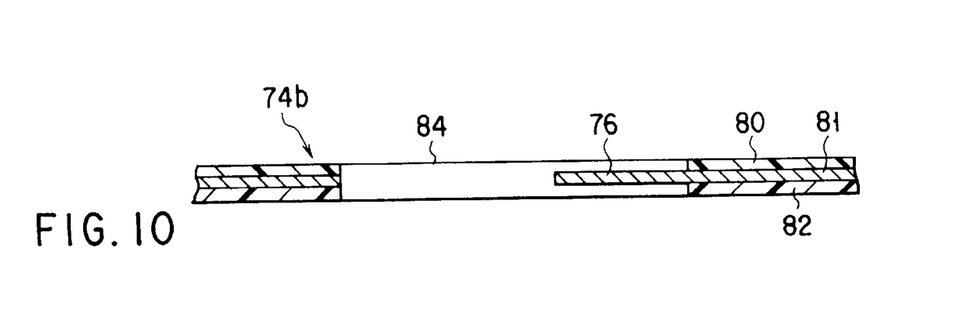
FIG. 10 is a cross-sectional view taken along the line X—X in FIG. 9.

As shown in FIGS. 8 to 10, the relay FPC 74 includes a base layer 80 made of an insulating material such as polyimide, a conductor pattern 81 made of a copper foil on the base layer and having first and second electrode pads 76 and conductor lines 78, and a cover layer 82 made of an insulating material and formed on the base layer over the conductor pattern 81 excluding the first electrode pads.

Five openings 84 with a substantially rectangular shape are formed at the connecting end portion 74b. The openings 84 are arranged in the longitudinal direction of the connecting end portion 74b with a certain interval. In particular, they are arranged in the same manner as the five bumps 66 of a corresponding set on the main FPC 56 side. Each opening 84 has a width W slightly larger than the diameter of the bump 66 and a length L sufficiently longer than the diameter of the bump 66. Each opening 84 is defined by a through hole which is formed by partially eliminating the base layer 80 and the cover layer 82 in the same shape.

The second electrode pads 76 and the auxiliary pad 77 provided in the connecting end portion 74b project into the respective openings 84 so as to close substantially half of each opening in the longitudinal direction. Accordingly, the second electrode pads 76 and the auxiliary pad 77 are exposed to the outside of the relay FPC on the base layer 80 side and the cover layer 82 side.

As shown in FIGS. 3 to 5 and 8, a thin plate (hereinafter referred to as flexure) 86 formed of a stainless steel with 30 μm thick is attached on the surface of the base layer 80 of the relay FPC 74 excluding the connecting end portion 74b. The relay FPC 74 is fixed to the carriage assembly 22 with the flexure 86 contacting with the surface of the arm and the suspension 30.

The connecting end portion 74b of the relay FPC 74 with the above-mentioned construction is electrically and mechanically connected to the extended end portion 54 of the main FPC by soldering the second electrode pads 76 and the auxiliary pad 77 to the respective bumps 66 of a corresponding set on the main FPC 54. In this case, the connecting end portion 74b and the extended end portion 54a of the main FPC are connected to each other by the following processes.

Figure 5:
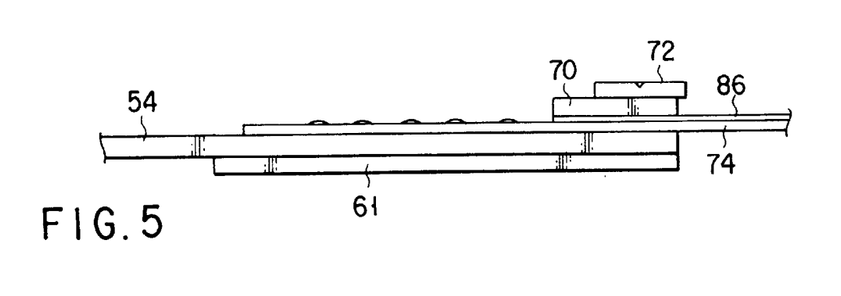
FIG. 5 is a bottom view of the connecting state.
Figure 11A:
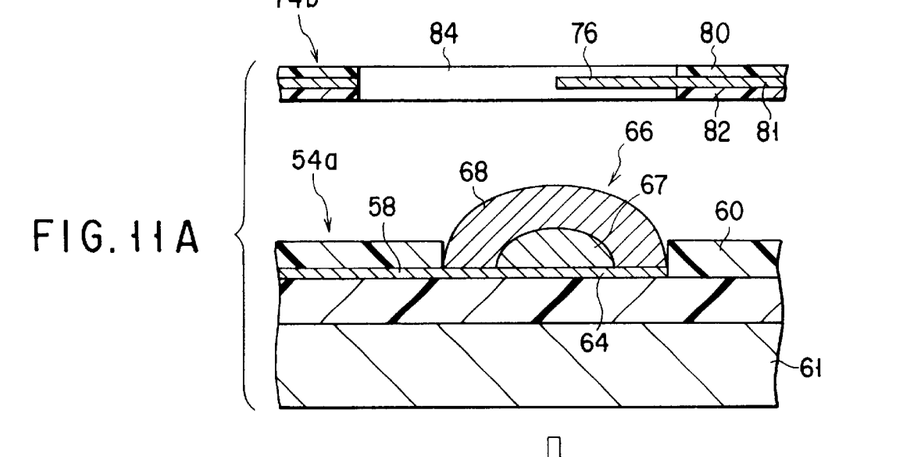
FIGS. 11A to 11C are cross-sectional views showing the connecting processes of the extended end portion of the main FPC and the connecting end portion of the relay FPC.

As shown in FIGS. 4, 5, and 11A, first, the connecting end portion 74b of the relay FPC 74 is positioned facing to the extended end portion 54a of the main FPC 54 such that the centers of the five openings 84 are aligned with the respective centers of the corresponding five bumps 66. The distal end portion of the connecting end portion 74b is adhered to an adhesive tape 87 attached on the surface of the extended end portion 54a. Then, the projecting piece 70 provided at the tip portion of the main FPC 54 is bent back over the proximal end portion of the connecting end portion 74b, thereby interposing the relay FPC 74 between the projecting piece 70 and the extended end portion 54a. In this state, by inserting a screw 72 through the through hole 72 and the notch 73 of the extended end portion 54a, and screwing the same into the screw hole 34a of the carriage assembly 22, the extended end portion 54a of the main FPC 54 and the connecting end portion 74b of the relay FPC 74 are fixed to the carriage assembly 22.

Figure 11B:
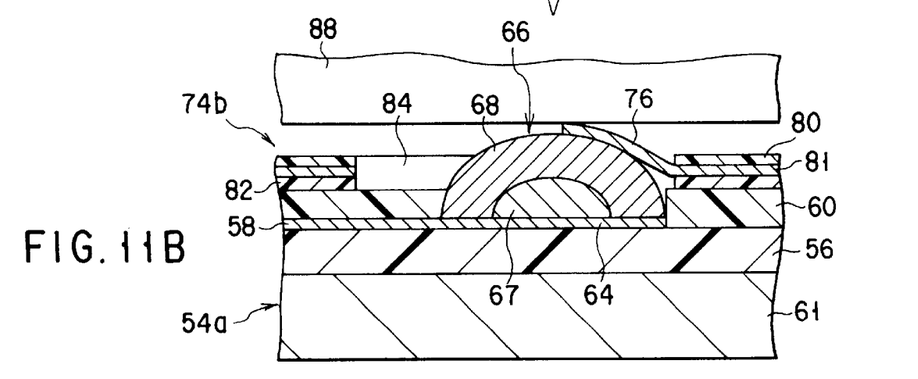

Thus, the connecting end portion 74b is positioned and held at a certain position with respect to the extended end portion 54a of the main FPC. As shown in FIG. 11B, the cover layer 82 of the connecting end portion 64b closely contacts with the cover layer 60 of the extended end portion 54a. Each bump 66 at the extended end portion 54a side enters in the opposing opening 84 of the connecting end portion 74b so as to contact with the second electrode pad 76 and push up it. Since the height of the bump 66 is set such that it projects from the cover layer 60 by a height larger than the thickness of the connecting end portion 74b, each of the second electrode pads 76 is pushed up by the bump 66 and projects from the base layer 80 through the opening 84.

Figure 11C:
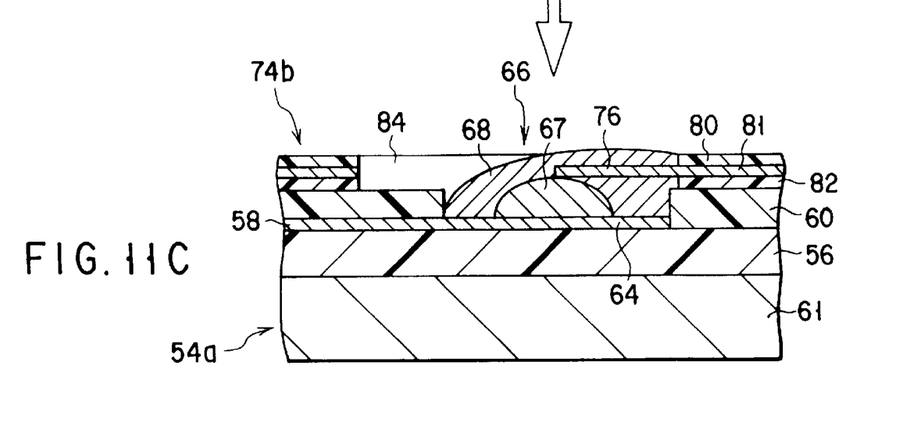

As shown in FIG. 11B, a heater chip 88 serving as a heating source is pressed on the second electrode pad 76 and the upper end of the bump 66 which project from the base layer 80 of the relay FPC 74, from the base layer 80 side. Accordingly, the solder layer 68 of the bump 66 is heated and melted via the second electrode pad 76. As shown in FIG. 1C, the molten solder flows in the opening 84 to the lower surface side of the second electrode pad 76 and also in the upper surface side of the second electrode pad 76 through the opening 84. Accordingly, the second electrode pad 76 is soldered to the corresponding connecting pad 64 through the bump 66.

Since the first bump 67 of each bump 66 has a melting point higher than that of the solder, it can present without melting, the second electrode pad 76 can be supported on the first bump 67 and soldered in a state substantially parallel to the connecting pad 64. As a result, the second electrode pad 76 of the relay FPC 74 can be connected to the connecting pad 64 on the extended end portion 54a side electrically and mechanically.

The auxiliary pad 77 provided at the connecting end portion 74b is also soldered to the auxiliary pad 65 of the main FPC 54 in the same process so as to reinforce the connection strength between the connecting end portion 74b and the main FPC 54.

By connecting the connecting end portion 74b of the relay FPC 74 to the extended end portion 54a of the main FPC 54 as mentioned above, the magnetic head 40 is electrically connected to the substrate unit 21 via the relay FPC 74 and the main FPC 54.

Further, since the main FPC extended end portion 54a is screwed to the carriage assembly 22 by the screw 72 with a part of the relay FPC 74 being clamped by the projecting piece 70, the flexure 86 attached on the base layer 80 of the relay FPC 74 contacts with the grand pattern 71 formed on the projecting piece 70. Accordingly, the arm and suspension fixed with the relay FPC 74 can conduct with the grand of the substrate unit 21 via the grand pattern 71 and the lead wires 62.

According to the HDD with the above-mentioned construction, the bumps 66 are provided on the connecting pads of the extended end portion 54a of the main FPC 54, the openings 84 are formed in the connecting end portion 74b of the relay FPC 74, and the second electrode pads 76 are exposed in the opening 84. Therefore, as mentioned above, in connecting the extended end portion 54a and the connecting end portion 74b of the relay FPC 74, the second electrode pads and the bumps 66 can be directly heated by the heater chip through the openings 84, thereby melting the solder quickly and sufficiently for soldering. Therefore, the connecting pads 64 on the main FPC 54 and the second electrode pads 76 on the relay FPC 74 can be connected easily and securely so that the connecting operativity can be improved.

Further, the connection state between the connecting pads and the second electrode pads can be visually confirmed through the openings 84 of the relay FPC 74 so that the connection reliability and the quality of the HDD can be improved.

Since the relay FPC 74 is connected to the extended end portion 54a of the main FPC 54 by screwing with the relay FPC being interposed by the projecting piece 70 of the extended end portion, the load of the screwing, acting on the relay FPC, can be reduced, and the flexure 86 attached on the relay FPC and the grand pattern 71 provided in the projecting piece securely contact with each other so that the grand connection of the carriage assembly 22 as a whole can be realized. Accordingly, the assembling operativity and the quality of the HDD can be improved.

Further, by attaching temporarily the distal end portion of the relay FPC 74 to the adhesive tape 87 in addition to screwing of the relay FPC 74, the relay FPC can be held the main FPC with a high positioning accuracy until the soldering operation is finished.

According to the all of the above-mentioned constructions, the connection reliability between the relay FPC and the main FPC can be improved so that a high quality HDD can be provided.

Figure 12:
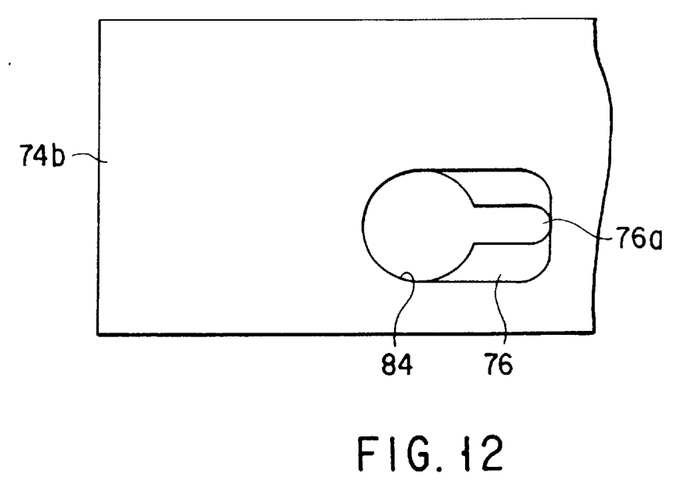
FIG. 12 is a schematic plan view of a modification of the pad portion of the relay FPC.

Although each of the second electrode pads 76 of the relay FPC 74 is formed such that it closes a substantially half part of the corresponding opening 84 in the above-mentioned embodiment, a slit 76 extending through the center of the opening 84 may be formed in the second electrode pad 76 in order to facilitate the contact with the heater chip at the time of connecting, as shown in FIG. 12. In this case, the second electrode pad 76 can be easily pushed up by the bump 66 of the main FPC 54, thereby ensuring a stable heating state.

Figure 13A:
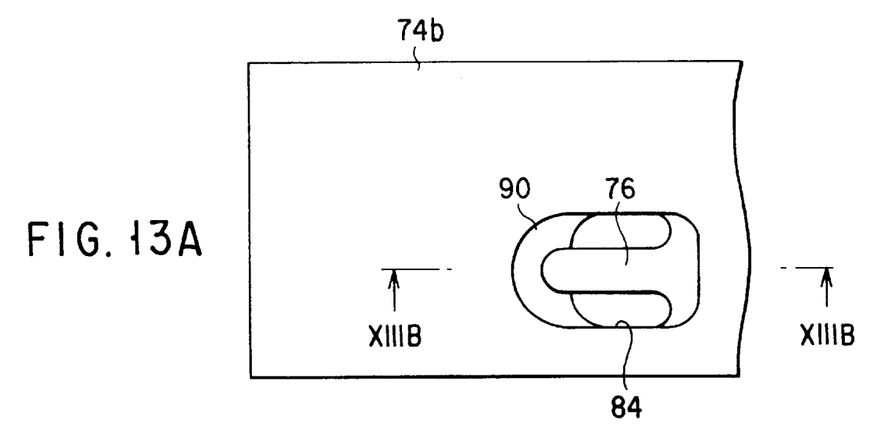
FIG. 13A is a schematic plan view of another modification of the pad portion of the relay FPC.
Figure 13B:
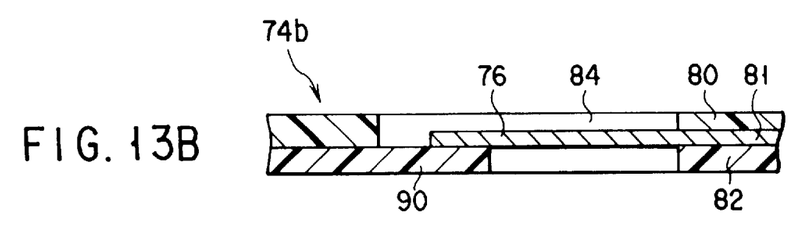
FIG. 13B is a cross-sectional view taken along the line XIIIB—XIIIB of FIG. 13A.
Figure 14:
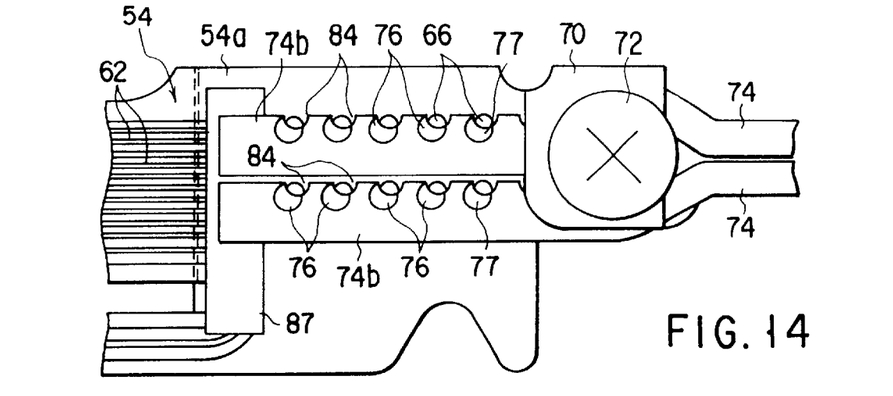
FIG. 14 is a plan view showing the connecting state of the extended end portion of the main FPC and the connecting end portion of the relay FPC.

According to a modification shown in FIGS. 13A and 13B, each of the second electrode pads 76 of the relay FPC 74 is formed in an elongate tongue-like shape extending form one end of the opening 84 toward the other end thereof in the longitudinal direction of the opening 84, that is, in a cantilever shape. Each opening 84 is formed such that the opening area on the cover layer 82 side is smaller than the opening area on the base layer 80 side, and the cover layer 82 serves as supporting portion 90 for supporting the free end of the second electrode pad 76.

According to this modification, since the second electrode pad 76 has an elongate tongue-like shape, the second electrode pad 76 can be pushed up easily by the bump 66 on the main FPC 54 side at the time of connection, and the space through which the molten solder flows can be enlarged so that the connection reliability can be further improved. Moreover, by the supporting portion 90 provided in the cover layer 82, deformation of the second electrode pad 76 is tolerated only on the heating source side and restricted in the opposite direction. Accordingly, in a state before connection, unnecessary play of the second electrode pad can be reduced to minimize the damage of the pad such as bent and separation.

FIGS. 14 to 17B show a main FPC 54 and the connecting end portion 74b of a relay FPC 74 of an HDD according to a second embodiment of the present invention. According to the second embodiment, each opening 84 formed in the connecting end portion 74b of the relay FPC 74 is defined by a substantially round-shaped notch opened to one side edge of the connecting end portion 74b. Each of second electrode pads 76 projects into the corresponding opening 84 such that it closes the base end side portion of the opening 84, that is, the end portion on the side away from the one side edge of the connecting end portion 74b.

Figure 15:
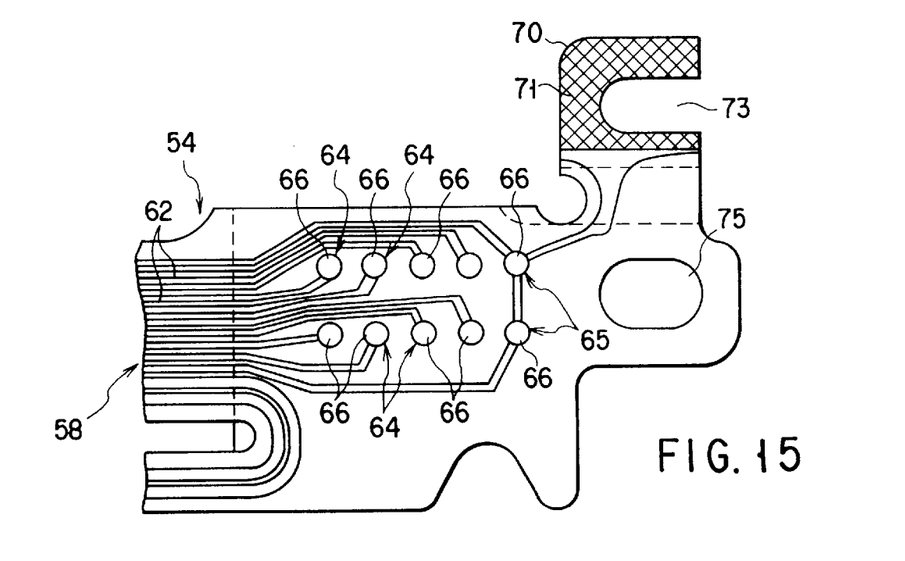
FIG. 15 is an enlarged plan view of the extended end portion of the main FPC.
Figure 16:
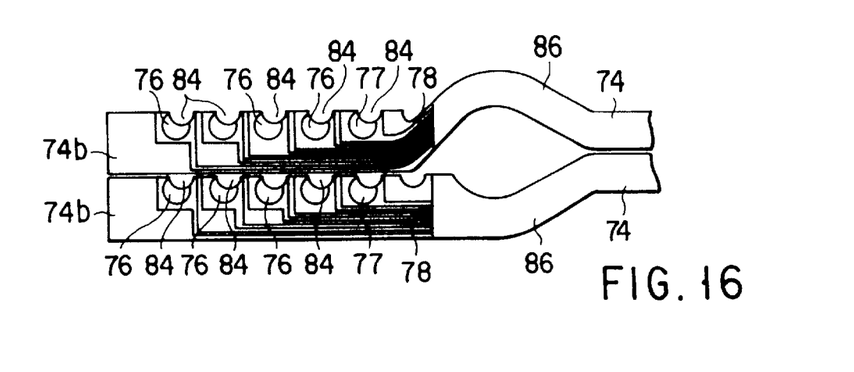
FIG. 16 is a plan view showing the connecting end portion of the relay FPC.
Figure 17A:
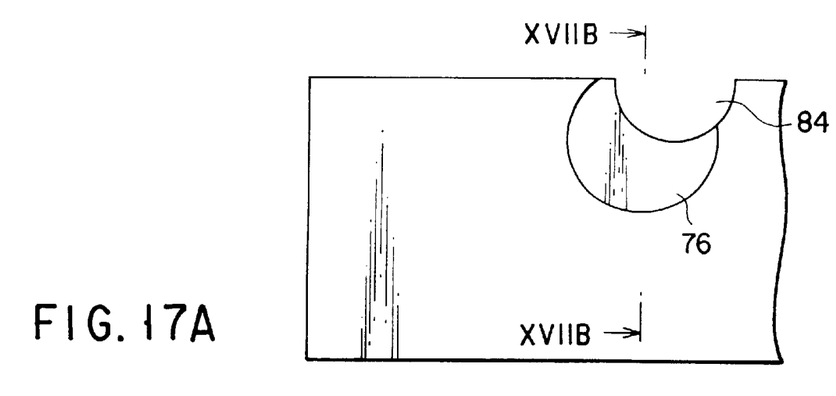
FIG. 17A is an enlarged plan view of the pad portion of the relay FPC.
Figure 17B:
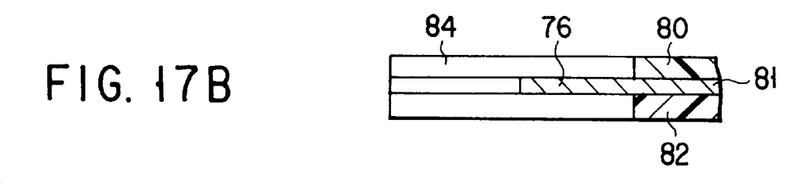
FIG. 17B is a cross-sectional view taken along the line XVIIB—XVIIB of FIG. 17A.

Bumps 66 on the extended end portion 54a of the main FPC 54 are disposed in a direction parallel to the longitudinal axis of the main FPC. Since the other construction is the same as those of the above-mentioned first embodiment, the same numerals represent the same parts, and its detail explanation will be omitted.

With the second embodiment, the same effects as in the first embodiment can be achieved. Further, according to the second embodiment, since the second electrode pads 76 of the relay FPC 74 are arranged along the one side edge of the connecting end portion 74b, the area of each second electrode pad can be enlarged. As a consequence, the connection reliability can be further improved. More specifically, in general, the relay FPC comprises inspection lead wires extending from the second electrode pads, and inspection pads connected to the respective inspection lead wires for inspecting the magnetic heads before connection. After the inspection, the inspection lead wires and pads are cut off from the connecting end portion 74b. With the construction where the second electrode pads 76 are arranged along one side edge of the connecting end portion 74b as in this embodiment, the inspection lead wires and pads can be completely cut off from the connecting end portion 74b so that the area of each second electrode pad can be enlarged.

Figure 18A:
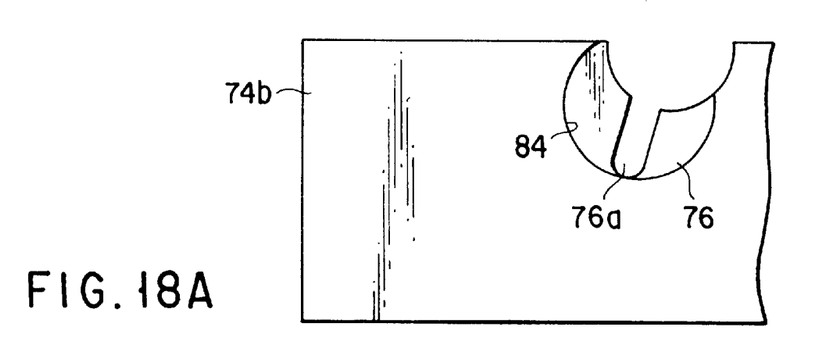
FIG. 18A is a schematic plan view of a modification of the pad portion of the relay FPC in the second embodiment.
Figure 18B:
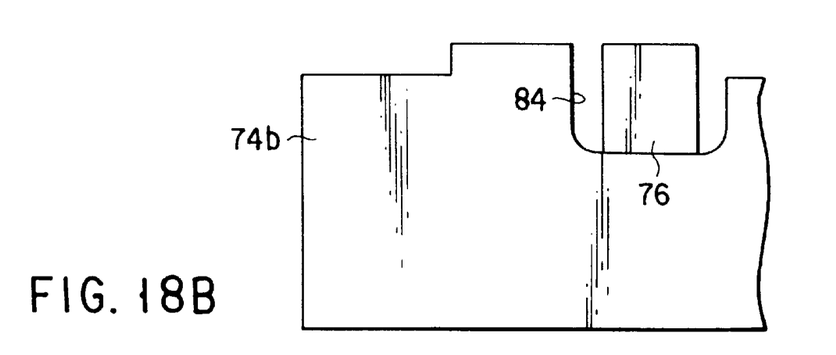
FIG. 18B is a schematic plan view of another modification of the pad portion of the relay FPC of the second embodiment.

As shown in FIG. 18A, the second electrode pad 76 can be provided with a slit 76a extending through the center thereof. Further, as shown in FIG. 18B, the second electrode pad 76 can be formed in an elongate tongue-like shape extending toward one side edge of the connecting end portion 74b, that is, in a cantilever shape.

The present invention is not limited to the above-mentioned embodiments and modifications, but can be changed in the scope of the present invention. For example, the shape of the second electrode pad and the opening may be modified in various ways if the second electrode pad is at least partially exposed in the opening. The number of the magnetic disks, the magnetic heads, the arms, and the like may be changed if required.

As heretofore explained in detail, according to the present invention, the bumps are provided on the connecting portion of the main flexible printed circuit board and the openings and the electrode pads projecting into the openings are provided in the relay flexible printed circuit board. Therefore, the electrode pads and/or the bumps can be heated directly through the openings, the connection state can be observed visually through the openings, the main flexible printed circuit board and the relay flexible printed circuit board can be connected to each other easily and securely. Thus, it is possible to provide a magnetic disk drive with a high connection reliability, a high quality, and a good assembling property, a head suspension assembly used for the magnetic disk drive, and a method of connecting the relay printed circuit board and the main printed circuit board of the magnetic disk drive.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A head suspension assembly used in a magnetic disk drive comprising:
   a plate-like suspension having one end on which a magnetic head is mounted and the other end fixed to an arm; and
   a relay printed circuit board mounted on the suspension and the arm, and having one end portion connected to the magnetic head, and a connecting end portion extending to the arm;
   the relay printed circuit board including a base layer, a conductor pattern formed on the base layer, a cover layer covering the conductor pattern, and a plurality of openings formed in the connecting end portion,
   each of the openings being defined by a through-hole penetrating the base layer and the cover layer of the relay printed circuit board, and opened to outer surfaces of the base layer and the cover layer,
   the conductor pattern having a plurality of movable electrode pads protruding into respective openings in a direction substantially in parallel to the base layer and the cover layer, each of the electrode pads closing a part of the opening corresponding to the electrode pad.

2. A head suspension assembly according to claim 1, wherein each of the electrode pads is arranged to close a part of the corresponding opening.

3. A head suspension assembly according to claim 1, wherein each of the openings is defined by a through hole penetrating the base layer and the cover layer of the relay printed circuit board.

4. A head suspension assembly according to claim 3, wherein each of electrode pads has a cantilever shape with respect to the corresponding opening, and one of the base and cover layers of the relay printed circuit board has a supporting portion projecting into the opening so as to support the free end of the electrode pad.

5. A head suspension assembly according to claim 1, wherein each of the openings has substantially the same shape at the base layer and the cover layer.

6. A magnetic disk drive comprising the head suspension assembly according to claim 1.

7. A head suspension assembly used in a magnetic disk drive comprising:
   a plate-like suspension having one end on which a magnetic head is mounted and the other end fixed to an arm; and
   a relay printed circuit board mounted on the suspension and the arm and having one end portion connected to the magnetic head, and a connecting end portion extending to the arm;
   the relay printed circuit board including a base layer, a conductor pattern formed on the base layer, a cover layer covering the conductor pattern, and a plurality of openings formed in the connecting end portion, which are opened to a side edge of the connecting portion, the conductor pattern having a plurality of electrode pads protruding into the openings, respectively.

8. A head suspension assembly according to claim 7, wherein each of the electrode pad has a cantilever shape with respect to the corresponding opening.

9. A head suspension assembly according to claim 7, wherein each of the electrode pads has a slit extending through substantially the center of the corresponding opening.

10. A magnetic disk drive comprising the head suspension assembly according to claim 7.

11. A head suspension assembly used in a magnetic disk drive comprising:
    a plate-like suspension having one end on which a magnetic head is mounted and the other end fixed to an arm; and
    a relay printed circuit board mounted on the suspension and the arm, and having one end portion connected to the magnetic head, and a connecting end portion extending to the arm;

the relay printed circuit board including a base layer, a conductor pattern formed on the base layer, a cover layer covering the conductor pattern, and a plurality of openings formed in the connecting end portion, each of the openings being defined by a through-hole penetrating the base layer and the cover layer of the relay printed circuit board, and opened to outer surfaces of the base layer and the cover layer, each of the openings having substantially the same shape and size at the base layer and the cover layer, the conductor pattern having a plurality of electrode pads protruding into respective openings in a direction substantially in parallel to the base layer and the cover layer, each of the electrode pads closing a part of the opening corresponding to the electrode pad.

12. A head suspension assembly according to claim 11, wherein each of the electrode pads has a cantilever shape with respect to the opening corresponding to the electrode pad.

13. A magnetic disk drive comprising the head suspension assembly according to claim 11.

14. A head suspension assembly used in magnetic disk drive comprising:

a plate-like suspension having one end on which a magnetic head is mounted and the other end fixed to an arm; and a relay printed circuit board mounted on the suspension and the arm, and having one end portion connected to the magnetic head, and a connecting end portion extending to the arm;

the relay printed circuit board including a base layer, a conductor pattern formed on the base layer, a cover layer covering the conductor pattern, and a plurality of openings formed in the connecting end portion, each of the openings being defined by a through-hole penetrating the base layer and the cover layer of the relay printed circuit board, and opened to outer surfaces of the base layer and the cover layer, the conductor pattern having a plurality of electrode pads protruding into respective openings in a direction substantially in parallel to the base layer and the cover layer, each of the electrode pads closing a part of the opening corresponding to the electrode pad and having a slit extending through substantially the center of the opening corresponding to the electrode pad, wherein the slit facilitates movement of the electrode pad in an axial direction of the opening corresponding to the electrode pad.

15. A head suspension assembly used in a magnetic disk drive comprising:

a plate-like suspension having one end on which a magnetic head is mounted and the other end fixed to an arm; and a relay printed circuit board mounted on the suspension and the arm, and having one end portion connected to the magnetic head, and a connecting end portion extending to the arm;

the relay printed circuit board including a base layer, a conductor pattern formed on the base layer, a cover layer covering the conductor pattern, and a plurality of openings formed in the connecting end portion, each of the openings being defined by a through-hole penetrating the base layer and the cover layer of the relay printed circuit board, and opened to outer surfaces of the base layer and the cover layer, the conductor pattern having a plurality of electrode pads protruding into respective openings in a direction substantially in parallel to the base layer and the cover layer, each of the electrode pads closing a part of the opening corresponding to the electrode pad and having a cantilever shape with respect to the opening corresponding to the electrode pad, one of the base and cover layers of the relay printed circuit board having a supporting portion projecting into each of the openings so as to support a free end of the electrode pad corresponding to the opening.

* * * * *